(12) United States Patent
Sugawara et al.

(10) Patent No.: US 10,559,600 B2
(45) Date of Patent: Feb. 11, 2020

(54) THIN FILM TRANSISTOR, DISPLAY DEVICE AND METHOD FOR PRODUCING THIN FILM TRANSISTOR

(71) Applicant: SAKAI DISPLAY PRODUCTS CORPORATION, Sakai-shi, Osaka (JP)

(72) Inventors: Yuta Sugawara, Sakai (JP); Takeshi Uno, Sakai (JP); Nobutake Nodera, Sakai (JP); Takao Matsumoto, Sakai (JP)

(73) Assignee: SAKAI DISPLAY PRODUCTS CORPORATION, Sakai-shi, Osaka (JP)

( * ) Notice: Subject to any disclaimer, the term of this patent is extended or adjusted under 35 U.S.C. 154(b) by 0 days.

(21) Appl. No.: 16/371,529

(22) Filed: Apr. 1, 2019

(65) Prior Publication Data

US 2020/0006395 A1    Jan. 2, 2020

(30) Foreign Application Priority Data

Jun. 28, 2018    (JP) .................................. 2018-123445

(51) Int. Cl.
*H01L 27/12*    (2006.01)
*H01L 29/45*    (2006.01)
(Continued)

(52) U.S. Cl.
CPC ........ *H01L 27/1229* (2013.01); *G02F 1/1368* (2013.01); *H01L 27/1285* (2013.01);
(Continued)

(58) Field of Classification Search
None
See application file for complete search history.

(56) References Cited

U.S. PATENT DOCUMENTS 5,648,662 A * 7/1997 Zhang ................. H01L 21/2026
257/59
6,020,224 A * 2/2000 Shimogaichi ....... H01L 21/2026
438/158
(Continued)

FOREIGN PATENT DOCUMENTS

JP    2012-114131 A    6/2012
WO    2011/055618 A1    5/2011
(Continued)

*Primary Examiner* — J. E. Schoenholtz
(74) *Attorney, Agent, or Firm* — ScienBiziP, P.C.

(57) ABSTRACT

A thin film transistor according to an embodiment of the present invention includes: a gate electrode supported by a substrate; a gate insulating layer covering the gate electrode; a silicon semiconductor layer being provided on the gate insulating layer and having a crystalline silicon region, the crystalline silicon region including a first region, a second region, and a channel region located between the first region and the second region, such that the channel region, the first region, and the second region overlap the gate electrode via the gate insulating layer; an insulating protection layer disposed on the silicon semiconductor layer so as to cover the channel region and allow the first region and the second region to be exposed; a source electrode electrically connected to the first region; and a drain electrode electrically connected to the second region. The channel region is higher in crystallinity than the first region and the second region.

14 Claims, 11 Drawing Sheets

(51) Int. Cl.
  *H01L 29/786* (2006.01)
  *H01L 29/66* (2006.01)
  *G02F 1/1368* (2006.01)
  *G09G 3/36* (2006.01)

(52) U.S. Cl.
  CPC ...... *H01L 29/458* (2013.01); *H01L 29/66765* (2013.01); *H01L 29/78606* (2013.01); *H01L 29/78678* (2013.01); *H01L 29/78696* (2013.01); *G02F 2202/103* (2013.01); *G02F 2202/104* (2013.01); *G09G 3/3677* (2013.01); *G09G 3/3688* (2013.01)

(56) References Cited

U.S. PATENT DOCUMENTS

| | | | |
|---|---|---|---|
| 6,204,519 B1 * | 3/2001 | Yamazaki | H01L 27/1214 257/72 |
| 8,530,899 B2 * | 9/2013 | Harumoto | H01L 29/66765 257/258 |
| 2011/0318891 A1 * | 12/2011 | Oda | H01L 29/42384 438/166 |
| 2012/0220140 A1 | 8/2012 | Kajiyama et al. | |
| 2013/0105802 A1 * | 5/2013 | Harumoto | H01L 29/66765 257/59 |
| 2018/0097120 A1 | 4/2018 | Ishida et al. | |
| 2018/0122839 A1 | 5/2018 | Nodera et al. | |

FOREIGN PATENT DOCUMENTS

| | | |
|---|---|---|
| WO | 2011/132559 A1 | 10/2011 |
| WO | 2016/157351 A1 | 10/2016 |
| WO | 2016/170571 A1 | 10/2016 |

* cited by examiner

THIN FILM TRANSISTOR, DISPLAY DEVICE AND METHOD FOR PRODUCING THIN FILM TRANSISTOR

BACKGROUND

1. Technical Field

The present invention relates to a thin film transistor, a display apparatus, and a method of producing a thin film transistor.

2. Description of the Related Art

Thin film transistors (TFT) are widely used as switching elements for the respective pixels of a display apparatus, e.g., a liquid crystal display or an organic EL (Electro-Luminescence) display, for example.

A thin film transistor is constructed so that a gate electrode, an insulating layer, a semiconductor layer (channel layer), a source electrode, and a drain electrode are formed on a substrate. Among others, a bottom-gate type thin film transistor is characterized in that the gate electrode is formed closer to the substrate than is the channel layer.

As an example of a bottom-gate type thin film transistor, Patent Document 1 (Japanese Laid-Open Patent Publication No. 2012-114131) discloses a structure in which an amorphous silicon layer in a channel section existing between a source electrode and a drain electrode is made polycrystalline by laser annealing technique, for example.

SUMMARY

The construction described in Patent Document 1, where a channel section existing between a source electrode and a drain electrode is bridged with a polycrystalline silicon layer, has an advantage of enhanced mobility, but also has problems associated with increased OFF current.

The present invention has been in view of the above circumstances, and an objective thereof is to provide a thin film transistor in which an OFF current can be lowered in a channel section existing between a source electrode and a drain electrode, a display apparatus in which the thin film transistor is used, and a method of producing the thin film transistor.

A thin film transistor according to an embodiment of the present invention comprises: a substrate; a gate electrode supported by the substrate; a gate insulating layer covering the gate electrode; a silicon semiconductor layer being provided on the gate insulating layer and having a crystalline silicon region, the crystalline silicon region including a first region, a second region, and a channel region located between the first region and the second region, such that the channel region, the first region, and the second region overlap the gate electrode via the gate insulating layer; an insulating protection layer disposed on the silicon semiconductor layer so as to cover the channel region and allow the first region and the second region to be exposed; a source electrode electrically connected to the first region; and a drain electrode electrically connected to the second region, wherein the channel region is higher in crystallinity than the first region and the second region.

In one embodiment, an average crystal grain size in the channel region is greater than an average crystal grain size in the first region and the second region.

In one embodiment, the channel region includes polycrystalline silicon; and the first region and the second region include microcrystalline silicon.

In one embodiment, the silicon semiconductor layer further comprises amorphous silicon region.

In one embodiment, a part of the insulating protection layer is located between the silicon semiconductor layer and the source electrode, and another part of the insulating protection layer is located between the silicon semiconductor layer and the drain electrode.

In one embodiment, an angle of inclination of a side face of the insulating protection layer is 45° or less.

In one embodiment, the thin film transistor further comprises: a first contact layer being disposed between the first region and the source electrode and connecting the source electrode and the first region; and a second contact layer being disposed between the second region and the drain electrode and connecting the drain electrode and the second region, wherein the first contact layer and the second contact layer each include an $n^+$ silicon layer containing an n type impurity.

A display apparatus according to one embodiment of the present invention comprises: the thin film transistors of claim 1; and a displaying region having a plurality of pixels, wherein the thin film transistors are respectively disposed in the plurality of pixels.

A method of producing a thin film transistor according to one embodiment of the present invention comprises: step (A) of providing a substrate, the substrate having formed on a surface thereof a gate electrode and a gate insulating layer covering the gate electrode; step (B) of forming a semiconductor film of amorphous silicon on the gate insulating layer; step (C) of forming an insulating film on the semiconductor film, and patterning the insulating film so as to form an insulating protection layer covering a portion of the semiconductor film to become a channel region; step (D) of irradiating the semiconductor film with laser light from above the insulating protection layer to crystallize the semiconductor film so that, in a region overlapping the gate electrode as viewed from a normal direction of the substrate, a portion of the semiconductor film that is covered by the insulating protection layer has a crystallinity which is higher than a crystallinity of a portion of the semiconductor film that is not covered by the insulating protection layer; and step (E) of forming a source electrode which is electrically connected to a part of the portion of the semiconductor film that is not covered by the insulating protection layer and a drain electrode which is electrically connected to another part of the portion of the semiconductor film that is not covered by the insulating protection layer.

In one embodiment, the laser light has a wavelength of about 351 nm, and the insulating protection layer is a silicon oxide layer.

In one embodiment, in step (D), only a portion of the semiconductor film is irradiated with the laser light to be crystallized, while a portion of the semiconductor film that was not irradiated with the laser light is left amorphous.

According to an embodiment of the present invention, there is provided a thin film transistor whose OFF current can be lowered.

DETAILED DESCRIPTION

Embodiments of the present invention will be specifically described with reference to the drawings.

Embodiment 1

Figure 1:
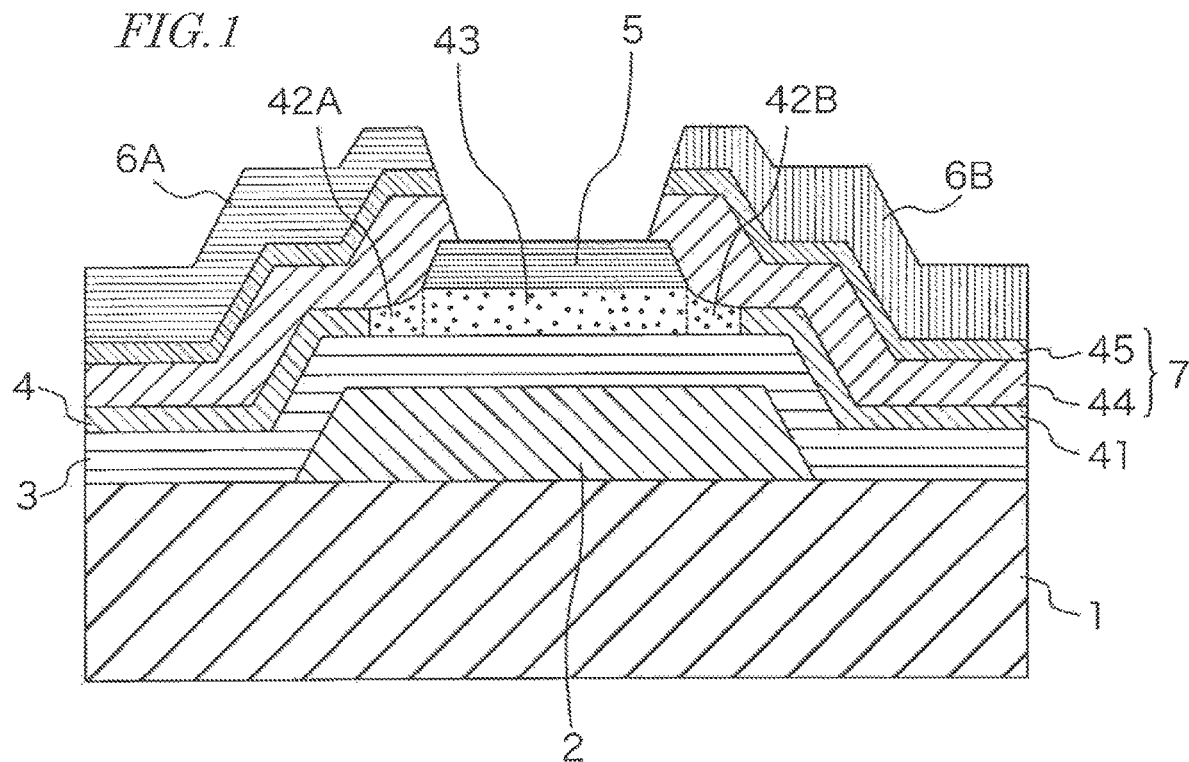
FIG. 1 is a schematic cross-sectional view describing the construction of a thin film transistor according to Embodiment 1.
Figure 2:
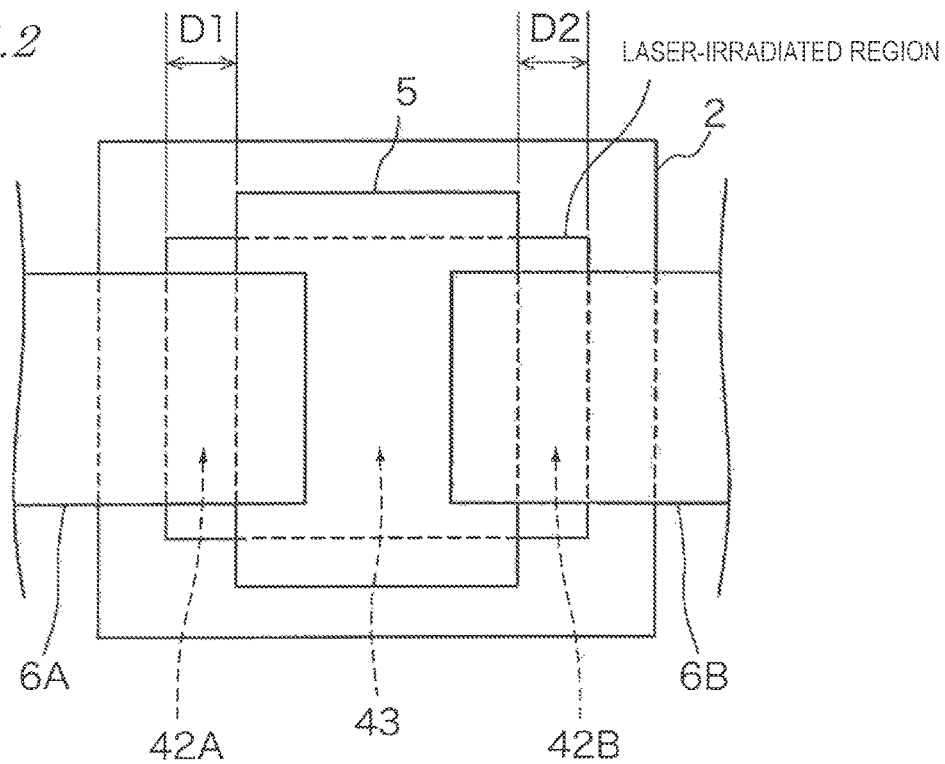
FIG. 2 is a schematic plan view describing the construction of a thin film transistor according to Embodiment 1.

FIG. 1 is a schematic cross-sectional view showing the construction of a thin film transistor according to Embodiment 1, and FIG. 2 is a schematic plan view thereof. A thin film transistor according to Embodiment 1 includes, for example, a gate electrode 2, a gate insulating layer 3, a semiconductor layer 4, a contact layer 7, an etch stop film (insulating protection layer) 5, a source electrode 6A, and a drain electrode 6B. For simplicity, the plan view of FIG. 2 only illustrates the relative positioning between the gate electrode 2, microcrystalline silicon regions 42A and 423 and a polycrystalline silicon region 43 composing the semiconductor layer 4, and the etch stop film 5, while any other constituent elements of the thin film transistor are shown elliptically.

The gate electrode 2, which is an electrode that is patterned on the surface of the substrate 1, can be formed by using a metal such as Al, Mg, Mo, Cr, Ta, Cu, Ti, Ni, W or Mn, an alloy whose main components are any such metals, metal oxides, or other materials, for example. Herein, an insulating substrate such as a glass substrate can be used as the substrate 1.

The gate insulating layer 3 is formed on the substrate 1 so as to cover the gate electrode 2. The gate insulating layer 3 may be an insulating film of an organic substance, or an insulating film of an inorganic substance. As an insulating film of an organic substance, TEOS (tetraethyl orthosilicate) may be used, for example. As an insulating film of an inorganic substance, $SiO_2$, $SiO_2/SiN$, SiN, SiON, $Al_2O_3$, $HfO_2$, or the like can be used, for example.

The semiconductor layer 4 has a first amorphous silicon region 41, microcrystalline silicon regions 42A and 42B, and a polycrystalline silicon region 43. The contact layer 7 includes a second amorphous silicon layer 44 and an $n^+$ silicon layer 45. The first amorphous silicon region 41 is formed on an upper side (i.e., opposite side from the substrate) of the gate insulating layer 3, and has a thickness of e.g. 25 nm or more. Moreover, similarly to the first amorphous silicon region 41, the microcrystalline silicon regions 42A and 42B and the polycrystalline silicon region 43 are also formed on the upper side of the gate insulating layer 3, thus existing within the same layer as the first amorphous silicon region 41.

In the present embodiment, the microcrystalline silicon regions 42A and 42B and the polycrystalline silicon region 43 are formed so as to be inside, in plan view, a region which is defined by the outer edge of the gate electrode 2 (which is a rectangular region in the example shown in FIG. 2; hereinafter the "gate region"). Also in the present embodiment, a region of the semiconductor layer 4 that is covered by the etch stop film 5 is the polycrystalline silicon region 43, whereas the regions flanking the polycrystalline silicon region 43 so that the polycrystalline silicon region 43 is interposed therebetween are respectively the microcrystalline silicon regions 42A and 42B. In other words, in the present embodiment, the region of the semiconductor layer 4 that is covered by the etch stop film 5 has a higher crystallinity than the crystallinity of the two outer regions thereof. Herein, the respective widths D1 and D2 of the regions 42A and 42B, which flank the polycrystalline silicon region 43 so that the polycrystalline silicon region 43 is interposed therebetween and which are not covered by the etch stop film 5, are preferably 3 μm or more each.

Note that the crystallinity (also referred to as "degree of crystallization") of the semiconductor layer 4 can be determined through observation of a cross-sectional shape by using a transmission electron microscope (TEM), for example. For instance, within a diffraction image from a transmission electron microscope, whatever lacks an annular diffraction pattern but only has an obscure halo pattern, or whatever has only a single annular diffraction pattern within a halo pattern, can be distinguished as amorphous. Moreover, within a diffraction image from a transmission electron microscope, whatever has two or more annular diffraction patterns (Debye-Scherrer rings) observed therein may be distinguished as polycrystalline if the number of observed Debye-Scherrer rings is large, or microcrystalline if the number is small.

Crystallinity of the semiconductor layer 4 can also be distinguished through shape measurement of the crystal grains using electron micrographs. For example, in a microcrystalline case, its crystal system may be either a cubic system or a hexagonal system, or may be in a state in which both crystal systems are mixed. Microcrystalline crystal grains may have a size which is not less than 1 nm and not more than 15 nm, preferably not less than 5 nm and not more than 15 nm, and more preferably not less than 10 nm and not more than 15 nm. In a polycrystalline case, it may be an aggregation of crystals with a plurality of surface orientations, or an aggregation of microcrystals which have grown predominantly with a certain surface orientation. Polycrystalline crystal grains may preferably have a size not less than 15 nm and not more than 10 μm.

Furthermore, a crystallization rate may be measured by using Raman spectroscopy. For example, the crystallization rate Xc is calculated as Xc=(Pc+Pm)/(Pc+Pm+Pa). Herein, Pc denotes a peak area of a peak near 520 $cm^{-1}$ in the Raman spectrum, (i.e., a peak area of silicon crystals); Pm denotes a peak area of a peak near 509 $cm^{-1}$ in the Raman spectrum (i.e., peak area of silicon microcrystals); and Pa denotes a peak area of a peak near 480 $cm^{-1}$ (i.e., a peak area of amorphous silicon). Anything with a measured crystallization rate Xc of 90% or more may be distinguished as polycrystalline; anything with that of less than 90% but not less than 50% as microcrystalline; and anything with that of less than 50% as amorphous.

On the upper side of the first amorphous silicon region 41 and microcrystalline silicon regions 42A and 42B as above, the contact layer 7 is formed. The contact layer 7 may include, for example, the second amorphous silicon layer 44 having a thickness on the order of 50 to 90 nm and an n silicon layer 45 being disposed on the second amorphous silicon layer 44 and having a thickness on the order of 10 to 50 nm. The $n^+$ silicon layer 45 is a silicon layer containing impurities such as phosphorus or arsenic at high concentrations.

On the upper side of the polycrystalline silicon region 43, the etch stop film 5 is formed in island shapes. The etch stop film 5 can be formed by using a material such as $SiO_2$, for example. In the present embodiment, the etch stop film 5 being located above the gate electrode 2 is formed so as to cover a partial region (i.e., a region in which the polycrystalline silicon region 43 is formed) of the semiconductor layer 4 inside the gate region.

On the contact layer 7 ($n^+$ silicon layer 45), a source electrode 6A and a drain electrode 6B are formed so as to be apart from each other, the source electrode 6A and the drain electrode 6B having a certain pattern. The source electrode 6A and the drain electrode 63 can be formed by using a metal such as Al, Mg, Mo, Cr, Ta, Cu, Ti, Ni, W or Mn, an alloy whose main components are any such metals, metal oxides, or other materials, for example. In the present embodiment, the source electrode 6A is formed above one microcrystalline silicon region 42A not being covered by the etch stop film 5, whereas the drain electrode 6B is formed above the other microcrystalline silicon region 42B not being covered by the etch stop film 5.

FIG. 3A through FIG. 3D are schematic cross-sectional views describing a method of producing the thin film transistor according to Embodiment 1. First, on the surface of the insulating substrate 1 such as a glass substrate, by sputtering technique, a metal film of e.g. a metal such as Al, Mg, Mo, Cr, Ta, Cu, Ti, Ni, W or Mn, an alloy whose main components are any such metals, metal oxides, or other materials is formed, and through photolithography using a photomask, dry etching of the metal film, delamination of the resist, and cleaning, the gate electrode 2 is patterned.

Next, by conducing film formation with a CVD (Chemical Vapor Deposition) technique using a material such as $SiO_2$ or SiN, for example, the gate insulating layer 3 is formed so as to cover the gate electrode 2 on the substrate 1. The gate insulating layer 3 may be a multilayer film of a material such as $SiO_2$ or SiN, for example.

Figure 3A:
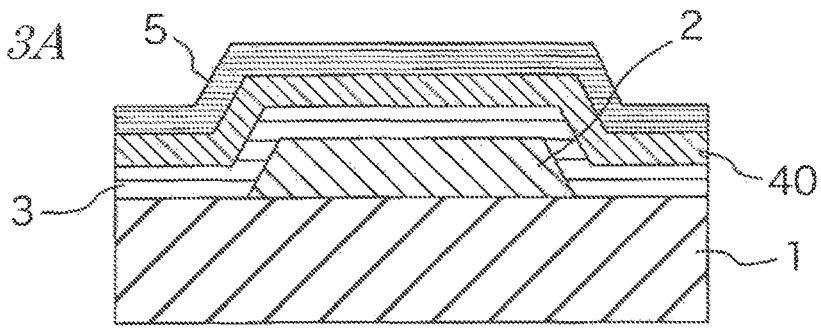
FIG. 3A is a schematic cross-sectional view describing a method of producing the thin film transistor according to Embodiment 1.

Next, by CVD technique, an amorphous silicon film 40 having a thickness on the order of 30 to 100 nm is formed. Moreover, an $SiO_2$ film having a thickness on the order of 100 to 125 nm is formed by CVD technique, whereby the etch stop film 5 is formed on the amorphous silicon film 40. FIG. 3A shows the gate electrode 2, the gate insulating layer 3, the amorphous silicon film 40, and the etch stop film 5 having been formed on the surface of the substrate 1.

Figure 3B:
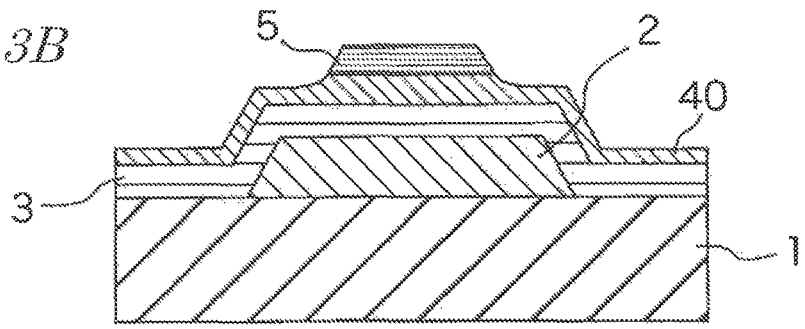
FIG. 3B is a schematic cross-sectional view describing a method of producing the thin film transistor according to Embodiment 1.

Next, dehydrogenation is carried out so as to attain a hydrogen concentration of 2 at % or less in the amorphous silicon film 40, and also photolithography using a photomask, dry etching of the metal film, dry etching of the etch stop film 5, delamination of the resist, and cleaning are carried out, whereby the etch stop film 5 is formed in island shapes. At this point, the amorphous silicon film 40 has a region covered by the etch stop film 5 and regions not covered by the etch stop film 5. The thickness of the region covered by the etch stop film 5 is greater than the thickness of the regions not covered by the etch stop film 5, and may be e.g. 25 nm or more. FIG. 3B shows the etch stop film 5 in having been formed in island shapes on the amorphous silicon film 40.

Next, from the upper side of the etch stop film 5, a region which is inside the gate region in plan view and which is larger than the region defined by the outer edge of the etch stop film 5 is irradiated with laser light (an energy beam), thereby annealing the amorphous silicon film 40. As the laser light used for annealing, an excimer laser using a gaseous mixture of XeF, KrF, XeCl, etc., having a wavelength of 200 to 400 nm, or a solid laser such as YAG (Yttrium Aluminum Garnet) or frequency-tripled laser. The laser light absorption rate of the amorphous silicon film 40 varies with the thickness of the etch stop film 5. In the present embodiment, the thickness of the etch stop film 5 is set from the following standpoints.

Figure 4:
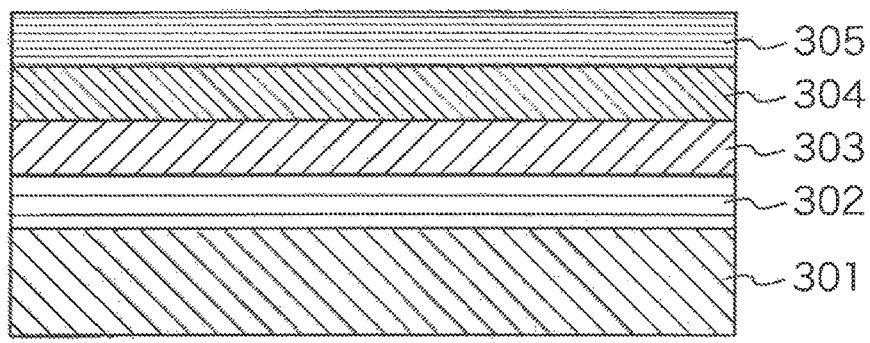
FIG. 4 is a schematic cross-sectional view showing a film structure model used in calculating a laser light absorption rate.
Figure 5:
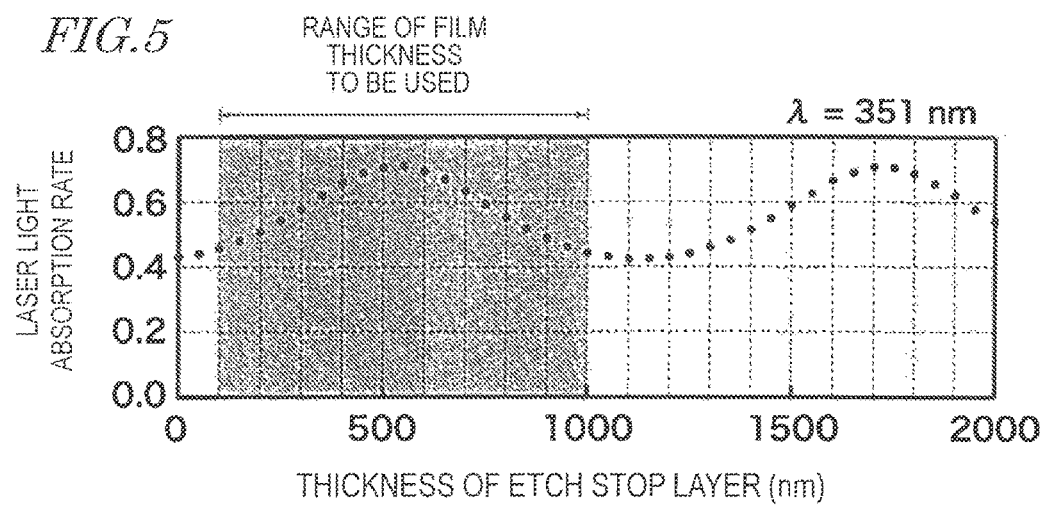
FIG. 5 is a graph showing results of calculating a laser light absorption rate.

FIG. 4 is a schematic cross-sectional view showing a film structure model used in calculating a laser light absorption rate, and FIG. 5 is a graph showing results of calculating the laser light absorption rate. In the present embodiment, a film structure model based on a multilayer film structure of five layers, i.e., the gate electrode 301, the gate insulating layers 302 and 303, the amorphous silicon layer 304, and the etch stop layer 305, is adopted. By taking into consideration the amplitude reflectance and amplitude transmittance at the interfaces between the films, the laser light absorption rate in the amorphous silicon layer was calculated.

The laser light used in calculation had a wavelength of 351 nm. The gate electrode 301 was an Mo film (thickness: arbitrary) having a refractive index of 3.06 and an extinction coefficient of 3.22 with respect to this laser light. The gate insulating layer 302 was an SiN film (thickness: fixed)

having a refractive index of 2.1 and an extinction coefficient of 0 with respect to this laser light, and the gate insulating layer 303 was an $SiO_2$ film (thickness: fixed) having a refractive index of 1.48 and an extinction coefficient of 0. The amorphous silicon layer 304 was an amorphous silicon film (thickness: fixed) having a refractive index of 4.5 and an extinction coefficient of 3.42. The etch stop layer 305 was a silicon oxide ($SiO_2$) film (thickness: variable) having a refractive index 1.48 and an extinction coefficient of 0.

By taking into consideration the multiple interference occurring when laser light having a wavelength of 351 nm strikes from a direction which is perpendicular to the surface of the aforementioned film structure model, a laser light absorptance in the amorphous silicon layer 304 was calculated, while varying the thickness of the etch stop layer 305.

The graph shown in FIG. 5 indicates results of calculating the laser light absorption rate in the amorphous silicon layer 304 while varying the thickness of the etch stop layer 305. In the graph, the horizontal axis represents the thickness (nm) of the etch stop layer 305, and the vertical axis represents the laser light absorption rate in the amorphous silicon layer 304. From the results of calculation shown in FIG. 5, it can be seen that the laser light absorption rate in the amorphous silicon layer 304 (corresponding to the amorphous silicon film 40) undergoes periodic changes with respect to the thickness of the etch stop layer 305 (corresponding to etch stop film 5), in an approximate range from 0.4 (local minimum) to 0.7 (local maximum).

In the present embodiment, the thickness of the etch stop film 5 is set by referring to the calculation results in FIG. 5. Specifically, a thickness is set such that the laser light absorption rate in the amorphous silicon film 40 takes a value within a predetermined range containing a local maximum (i.e., a range excluding any local minimums or values in the neighborhoods of local minimums).

For example, in the present embodiment, the thickness of the etch stop film 5 is set in a range from 100 to 100 nm so that the laser light absorption rate in the amorphous silicon film 40 will take a value within a predetermined range containing a local maximum, and the etch stop film 5 is formed so as to result in the thickness which has been set. Thereafter, through dry etching, delamination of the resist, and cleaning, the etch stop film 5 is formed into island shapes, followed by irradiation with laser light (excimer laser or solid laser) having the aforementioned wavelength, whereby the amorphous silicon film 40 is annealed and crystallized.

When the thickness of the etch stop film 5 is in a range from 100 to 100 nm, the laser light absorption rate of the amorphous silicon film 40 is higher than that in the case where the etch stop film 5 does not exist (i.e., the thickness being 0). In other words, in the present embodiment, the etch stop film 5 serves as an antireflection coating.

Therefore, the thermal energy occurring in the region of the amorphous silicon film 40 that is covered by the etch stop film 5 is higher than the thermal energy occurring in the regions not covered by the etch stop film 5, thus resulting in an increased effective thermal energy being available for amorphous silicon to crystallize. As a result, the crystallinity of the region that is covered by the etch stop film 5 becomes higher than the crystallinity of the regions not covered by the etch stop film 5. Consequently, for example, a portion of the amorphous silicon turns into polycrystalline silicon in the region of the amorphous silicon film 40 that is covered by the etch stop film 5, whereas a portion of the amorphous silicon turns into microcrystalline silicon in the regions not covered by the etch stop film 5.

Figure 3C:
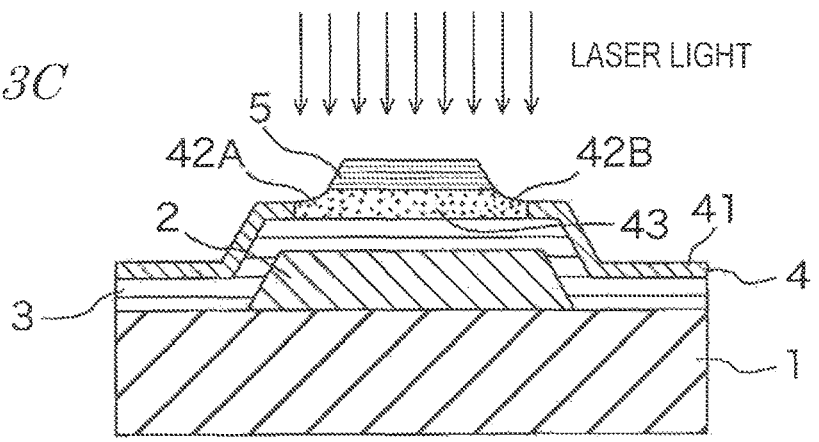
FIG. 3C is a schematic cross-sectional view describing a method of producing the thin film transistor according to Embodiment 1.

By annealing the amorphous silicon film 40 from above the etch stop film 5 using the aforementioned laser light, the polycrystalline silicon region 43 is created in the region of the amorphous silicon film 40 that is covered by the etch stop film 5, and the microcrystalline silicon regions 42A and 42B are created in the regions flanking the polycrystalline silicon region 43 on both sides and not being covered by the etch stop film 5. Any region of the amorphous silicon film 40 which was not irradiated with the laser light remains amorphous (i.e., the first amorphous silicon region 41). FIG. 3C shows a state where, through annealing with laser light, a semiconductor layer 4 including the first amorphous silicon region 41, microcrystalline silicon regions 42A and 42B, and the polycrystalline silicon region 43 has been formed.

Next, by CVD technique, a film of amorphous silicon having a thickness on the order of 30 to 100 nm (or 50 to 90 nm) is formed, whereby the second amorphous silicon layer 44 is formed. Moreover, by CVD technique, a film of amorphous silicon having a high impurity concentration, e.g., phosphorus or arsenic is formed, whereby the $n^+$ silicon layer 45 having a thickness on the order of 10 to 50 nm is formed on the second amorphous silicon layer 44.

Figure 3D:
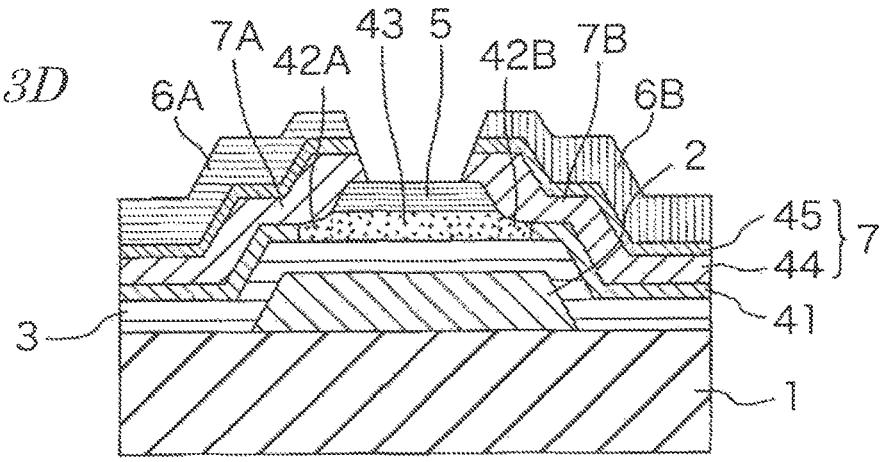
FIG. 3D is a schematic cross-sectional view describing a method of producing the thin film transistor according to Embodiment 1.

Next, by sputtering technique, a metal film of e.g. a metal such as Al, Mg, Mo, Cr, Ta, Cu, Ti, Ni, W or Mn, an alloy whose main components are any such metals, metal oxides, or other materials is formed, and through photolithography using a photomask, dry etching of the metal film, delamination of the resist, and cleaning, the source electrode 6A and the drain electrode 6B are patterned onto the contact layer 7. At this time, the photolithography using a photomask and dry etching of the metal film are performed in such a manner that the source electrode 6A and the drain electrode 6B are apart from each other upon the etch stop film 5, and that a portion of the source electrode 6A is located above the microcrystalline silicon region 42A and a portion of the drain electrode 6B is located above the microcrystalline silicon region 42B. Similarly, the contact layer 7 may also be separated between the source electrode 6A side and the drain electrode 6B side. Within the contact layer 7, a portion 7A connecting the source electrode 6A and the microcrystalline silicon region 42A will be referred to as a first contact layer, and a portion 7B connecting the drain electrode 6B and the microcrystalline silicon region 428 will be referred to as a second contact layer. FIG. 3D shows the source electrode 6A and the drain electrode 6B having been formed.

Figure 6:
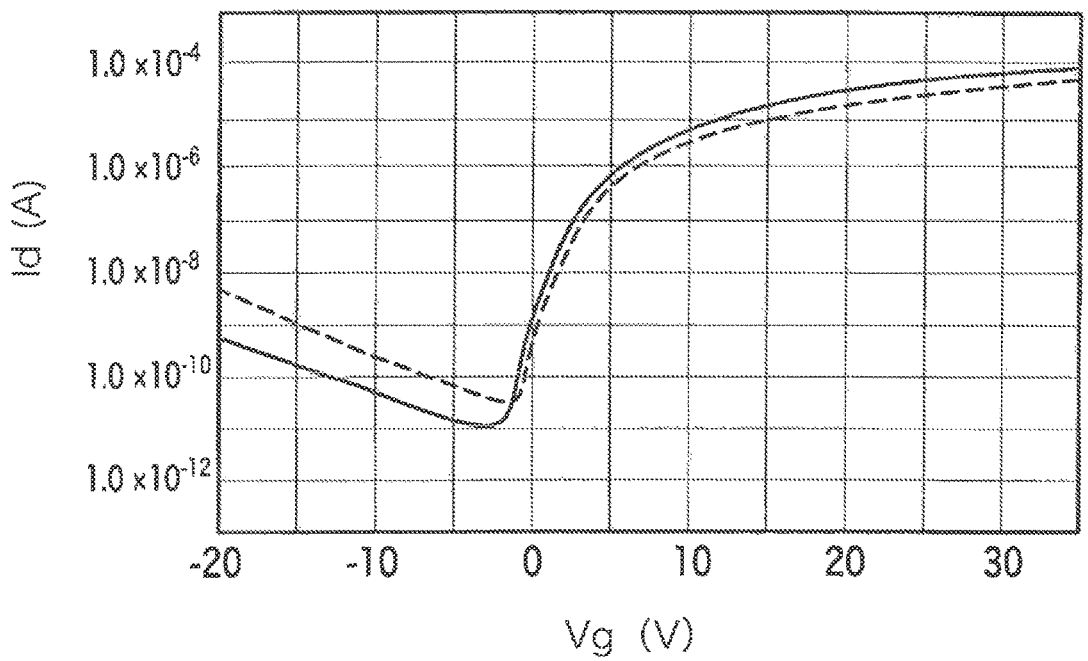
FIG. 6 is a graph showing Vg-Id characteristics of a thin film transistor according to the present embodiment.

Next, electrical characteristics of a thin film transistor according to the present embodiment will be described. FIG. 6 is a graph showing Vg-Id characteristics of a thin film transistor according to the present embodiment. In the graph, the horizontal axis represents the gate voltage Vg(V), and the vertical axis represents the drain current Id(A). The value of the drain voltage Vd is supposed to be 10 V. In FIG. 6, the solid-line graph represents the Vg-Id characteristics of the thin film transistor according to the present embodiment, whereas the broken-line graph represents the Vg-Id characteristics of a thin film transistor according to Comparative Example, of which channel section was composed only of a polycrystalline silicon region.

From the graph shown in FIG. 6, the following electrical characteristics were derived.

(1) The mobility was 6.05 $cm^2$/Vs for Comparative Example, and 9.55 $cm^2$/Vs for the thin film transistor according to the present embodiment.

(2) The subthreshold coefficient was 4.2 V/dec for Comparative Example, and 3.47 V/dec for the thin film transistor according to the present embodiment.

(3) The threshold voltage was 0.89 V for Comparative Example, and 0.84 V for the thin film transistor according to the present embodiment.

(4) The OFF current under a gate voltage of −15 V was $1.03 \times 10^{-9}$ A for Comparative Example, and $1.81 \times 10^{-10}$ A for the thin film transistor according to the present embodiment.

It was found from the above results that, the OFF current can be reduced in the present embodiment by about one digit, while improving on mobility, as compared to the thin film transistor of Comparative Example.

Thus, in the present embodiment, the polycrystalline silicon region 43, the microcrystalline silicon regions 42A and 42B, and the first amorphous silicon region 41 are coupled with smooth band gap junctions, at edges of the source electrode 6A and the drain electrode 6B. As a result, field intensity can be reduced at the edges of the source electrode 6A and the drain electrode 6B, whereby a thin film transistor having a small OFF current and supersaturation current can be provided.

In the present embodiment, the edge of the etch stop film 5 preferably has a gentle inclination (e.g., an inclination of 45 degrees or less).

Figure 7:
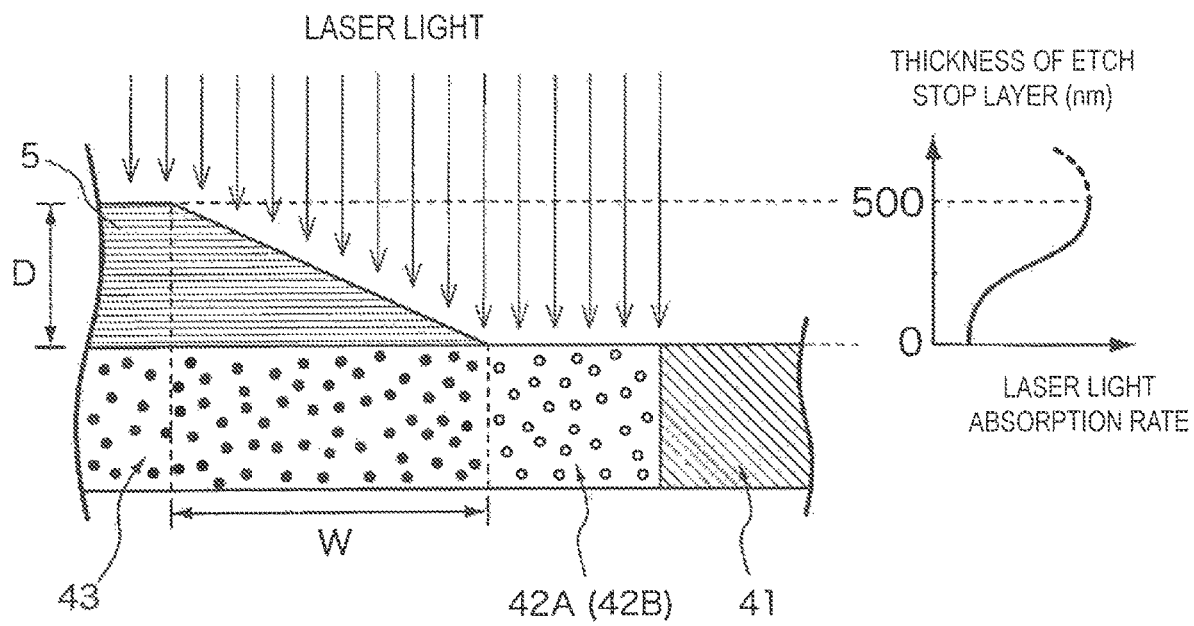
FIG. 7 is an explanatory diagram explaining a relationship between the angle of inclination and the crystallinity of an etch stop film at an edge.

FIG. 7 is an explanatory diagram explaining a relationship between the angle of inclination and the crystallinity of the etch stop film 5 at its edge (side face). As shown in FIG. 7, when the etch stop film 5 has a slanted edge, the thickness of the etch stop film 5 at the edge varies from 0 to D (where D is a predetermined thickness). The region W of varying thickness becomes broader as the angle of inclination of the edge becomes smaller. In the present embodiment, the polycrystalline silicon region 43 and the microcrystalline silicon regions 42A and 42B are formed by subjecting the amorphous silicon film 40 to annealing with laser light. Moreover, the crystallinity levels in these regions vary with the thickness of the etch stop film 5. In particular, when the etch stop film 5 has a thickness of 50 nm or less, crystallinity will monotonically increase as the thickness increases from the portion with zero thickness, and thus the band gap junctions between the microcrystalline silicon regions 42A and 42B and the polycrystalline silicon region 43 will also be smooth. From the above, in the present embodiment, the edge of the etch stop film 5 preferably has a gentle inclination (e.g., an inclination of 45 degrees or less). The angle of inclination of the edge of the etch stop film 5 may also be 20 degrees or more. Note that the angle of inclination of the etch stop film 5 can be controlled by adjusting the gas pressure or resist shape during dry etching as appropriate.

Figure 8:
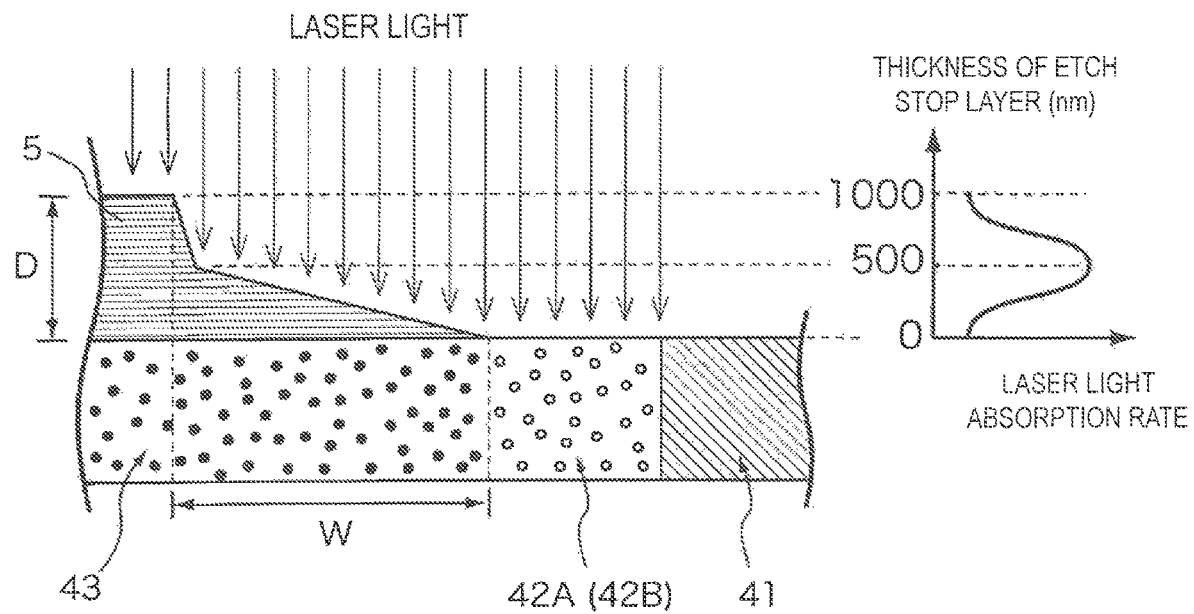
FIG. 8 is an explanatory diagram explaining a relationship between the angle of inclination and the crystallinity of an etch stop film at an edge.

FIG. 8 shows a case where the etch stop film 5 has a thickness of 50 nm or more. Laser light absorptance will be highest in a region where the etch stop film 5 has a thickness in the vicinity of 50 nm, possibly causing ablation. Therefore, in order to reduce the region where the etch stop film 5 has a thickness in the vicinity of 50 nm, the angle of inclination of an edge in the upper portion of the etch stop film 5 (including any portion having a height of 50 nm or more from the lower face of the etch stop film 5) may be made larger than the angle of inclination of an edge in the lower portion, which is located closer to the substrate than is the upper portion, of the etch stop film 5. For example, the angle of inclination of the edge in the upper portion of the etch stop film 5 may be a steep angle (e.g. not less than 60 degrees and not more than 90 degrees), while the angle of inclination of the edge in the lower portion may be 45 degrees or less. Note that the angle of inclination of the etch stop film 5 can be altered through multiple steps of etching.

Next, variants in which the gate electrode 2, the crystalline silicon region (i.e., laser-irradiated region), and the etch stop film 5 have a different relative positioning from that of Embodiment 1 will be described.

(Variant 1)

Figure 9:
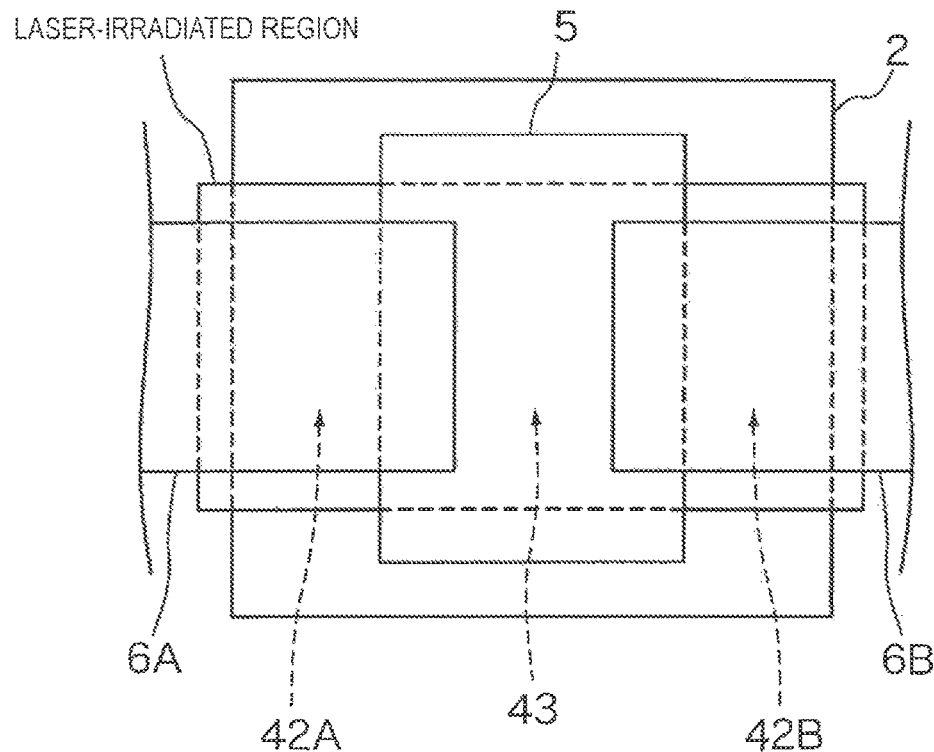
FIG. 9 is a schematic plan view of a thin film transistor according to Variant 1.

FIG. 9 is a schematic plan view of a thin film transistor according to Variant 1. In Variant 1, the crystalline silicon region (i.e., the laser-irradiated region) protrudes out of the gate region. Such a construction is formed by expanding the region irradiated with the laser light to outside of the gate region, during annealing of the amorphous silicon film 40.

(Variant 2)

Figure 10:
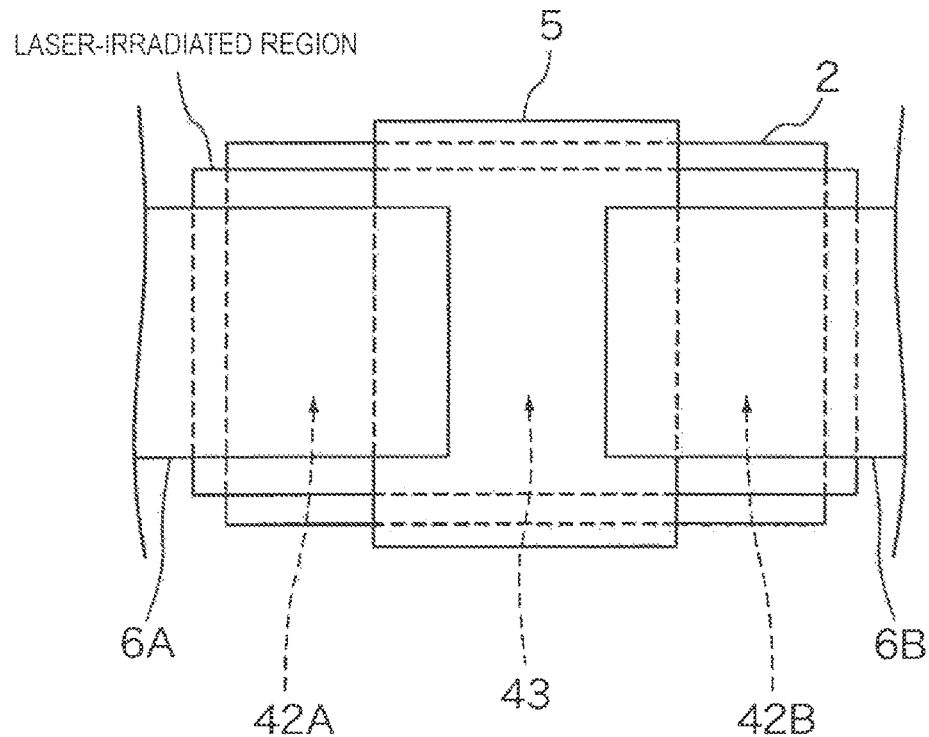
FIG. 10 is a schematic plan view of a thin film transistor according to Variant 2.

FIG. 10 is a schematic plan view of a thin film transistor according to Variant 2. In Variant 2, the crystalline silicon region (i.e., the laser-irradiated region) is formed so as to protrude out of the gate region, and the etch stop film 5 has portions protruding from the gate region. Such a construction is formed by expanding the range of the photomask to outside of the gate region when etching the etch stop film 5, so that portions outside of the gate region will be left. It is also formed by, during annealing of the amorphous silicon film 40, expanding the region irradiated with the laser light to outside of the gate region.

(Variant 3)

Figure 11:
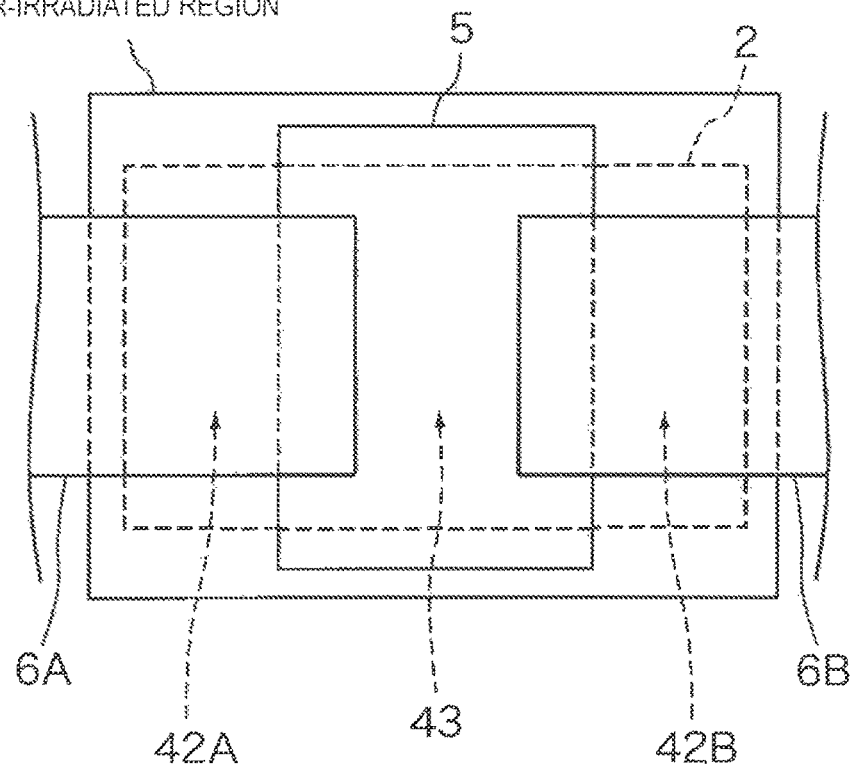
FIG. 11 is a schematic plan view of a thin film transistor according to Variant 3.

FIG. 11 is a schematic plan view of a thin film transistor according to Variant 3. In Variant 3, the etch stop film 5 has portions protruding from the gate region, and the crystalline silicon region (i.e., the laser-irradiated region) protrudes out of the gate region and the region defined by the outer edge of the etch stop film 5. Such a construction is formed by expanding the range of the photomask to outside of the gate region when etching the etch stop film 5, so that portions outside of the gate region will be left. It is also formed by, during annealing of the amorphous silicon film 40, expanding the region irradiated with the laser light to outside of the gate region and the region defined by the outer edge of the etch stop film 5.

(Variant 4)

Figure 12:
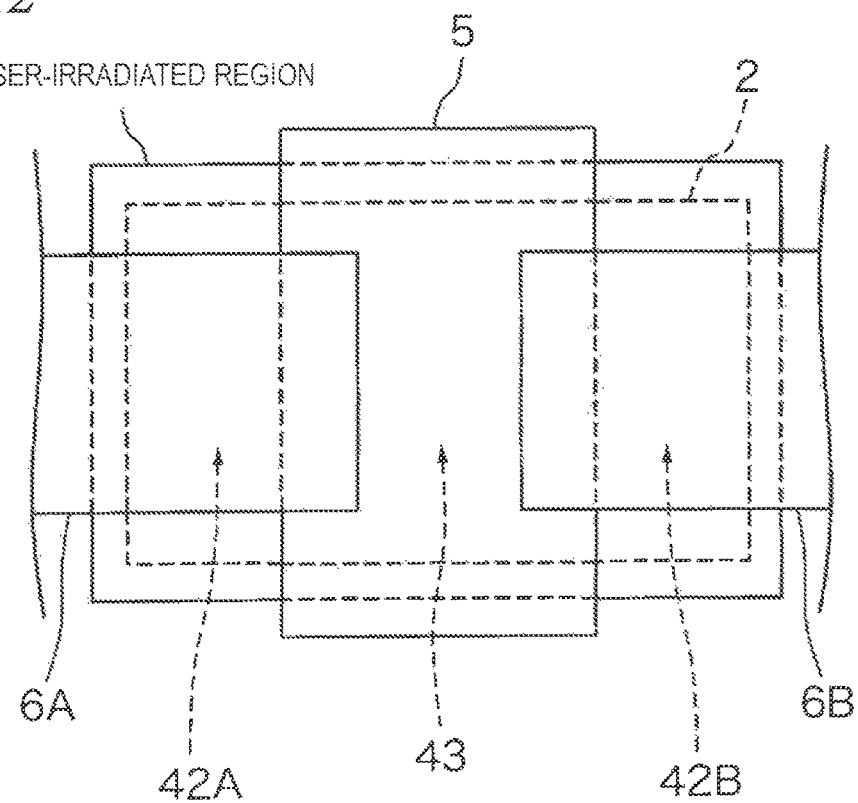
FIG. 12 is a schematic plan view of a thin film transistor according to Variant 4.

FIG. 12 is a schematic plan view of a thin film transistor according to Variant 4. In Variant 4, the crystalline silicon region (i.e., the laser-irradiated region) is formed so as to protrude out of the gate region, and the etch stop film 5 has portions protruding out of the gate region and the crystalline silicon region (i.e., the laser-irradiated region). Such a construction is formed by expanding the range of the photomask to outside of the gate region and the crystalline silicon region (i.e., the laser-irradiated region) when etching the etch stop film 5, such that portions outside of the crystalline silicon region (i.e., the laser-irradiated region) will be left. It is also formed by, during annealing of the amorphous silicon film 40, expanding the region irradiated with the laser light to outside of the gate region.

(Variant 5)

Figure 13:
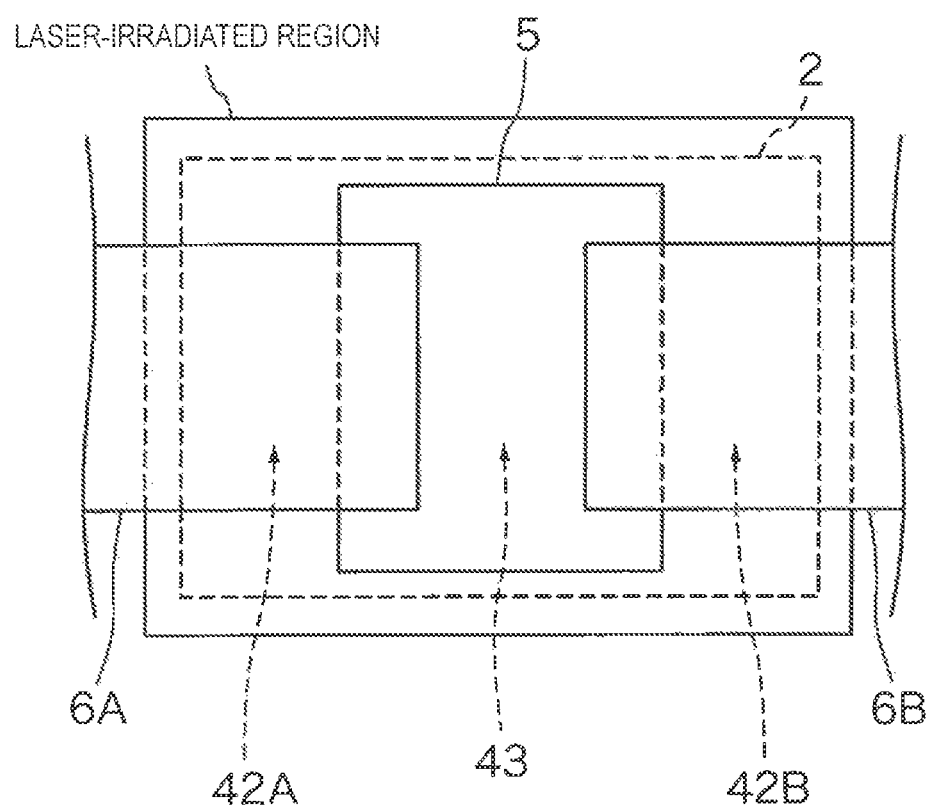
FIG. 13 is a schematic plan view of a thin film transistor according to Variant 5.

FIG. 13 is a schematic plan view of a thin film transistor according to Variant 5. In Variant 5, during annealing of the amorphous silicon film 40, the crystalline silicon region (i.e., the laser-irradiated region) is formed so as to protrude from the gate region, and the etch stop film 5 is formed in a region inside the gate region. Such a construction is formed by forming, restricting the range of the photomask to inside the gate region when etching the etch stop film 5. It is also formed by, during annealing of the amorphous silicon film 40, expanding the region irradiated with the laser light to outside of the gate region.

Embodiment 2

In Embodiment 2, the construction of a display apparatus incorporating the thin film transistor according to the present embodiment will be described.

Figure 14:
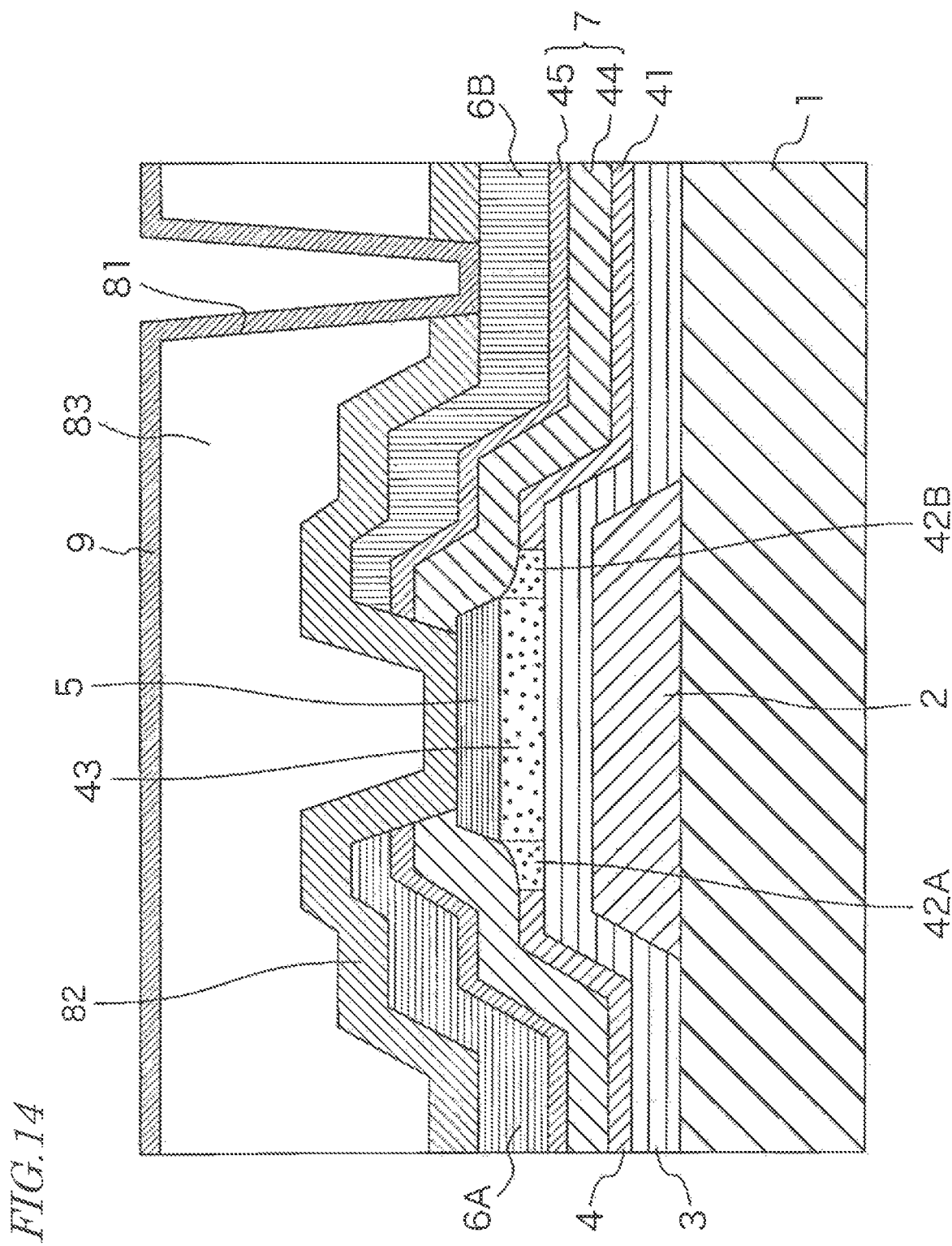
FIG. 14 is a schematic cross-sectional view describing the construction of a thin film transistor according to Embodiment 2.

In the case where the thin film transistor of Embodiment 1 is used as switching elements in a liquid crystal display apparatus, a passivation film 82, an organic film 83, and pixel electrodes 9 are sequentially formed in layers above the source electrode 6A and the drain electrode 61 (see FIG. 14).

FIG. 14 is a schematic cross-sectional view describing the construction of a thin film transistor according to Embodiment 2. The thin film transistor of Embodiment 2 may include, for example, a gate electrode 2, a gate insulating layer 3, a semiconductor layer 4, an etch stop film 5, a contact layer 7, a source electrode 6A and a drain electrode 6B, and a passivation film 82, an organic film 83, and a pixel electrode 9. Note that the gate electrode 2, the gate insulating layer 3, the semiconductor layer 4, the etch stop film 5, the contact layer 7, the source electrode 6A and the drain electrode 63 are similar in construction to those in Embodiment 1.

The passivation film 82 is formed in a layer above the source electrode 6A and the drain electrode 6B, by using a CVD technique employing SiN or the like, for example. In a layer above the passivation film 82, the organic film 83 of an acrylic resin, etc., is formed. Thereafter, through patterning with photolithography, dry etching, delamination of the resist and cleaning, a contact hole 81 for the drain electrode 6B is made. In a layer above the organic film 83, an ITO (Indium Tin Oxide) film is formed by sputtering technique, which is then patterned to give the pixel electrode 9.

Figure 15:
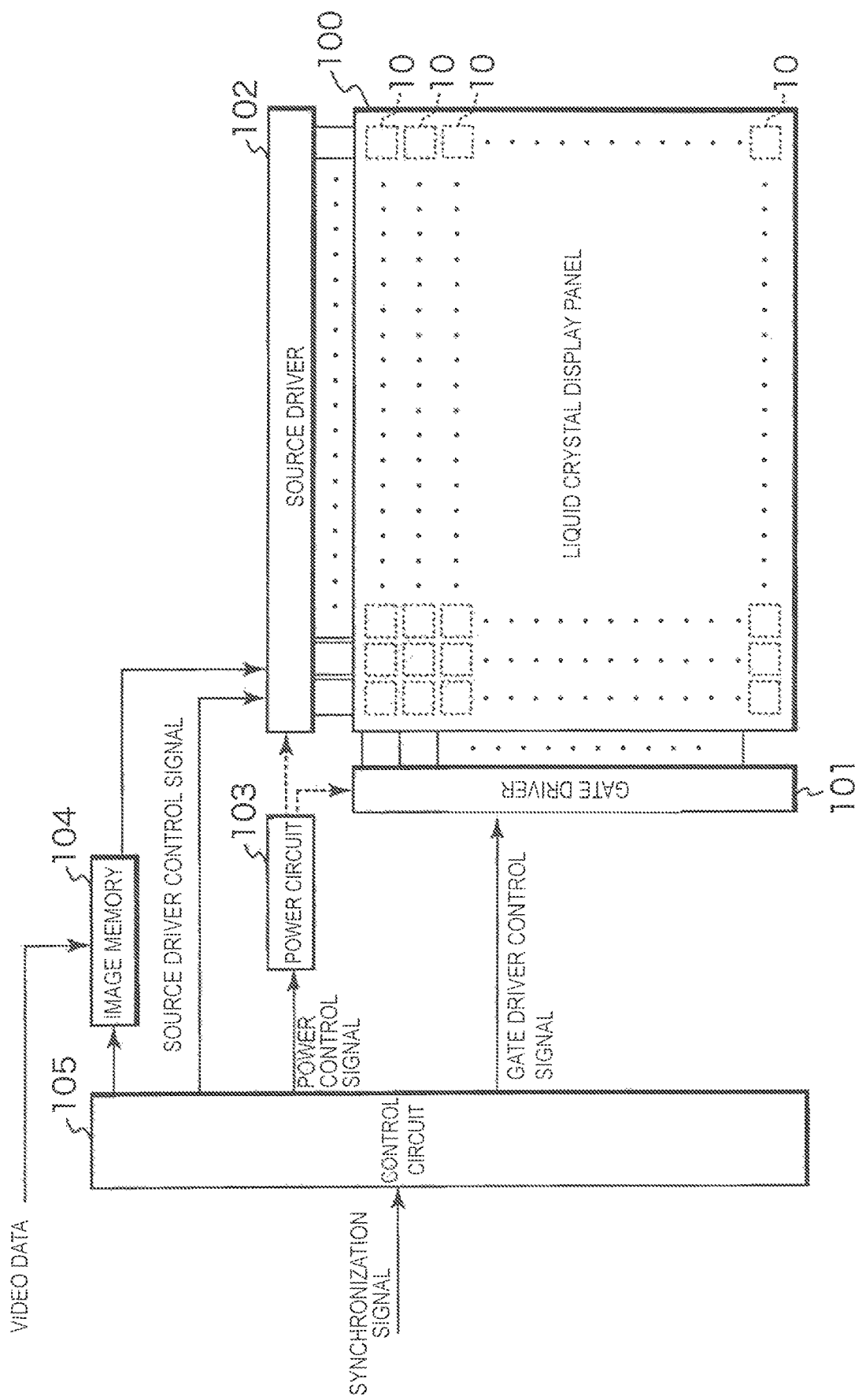
FIG. 15 is a block diagram describing the construction of a display apparatus according to Embodiment 2.

FIG. 15 is a block diagram describing the construction of the display apparatus of Embodiment 2. The display apparatus shown in FIG. 15 represents an exemplary liquid crystal display apparatus, including, for example, a liquid crystal display panel 100, a gate driver 101, a source driver 102, a power circuit 103, an image memory 104, and a control circuit 105.

In synchronization with an externally input synchronization signal, the control circuit 105 outputs control signals with which the gate driver 101, the source driver 102, the power circuit 103, and the image memory 104 are controlled.

The image memory 104 temporarily stores video data to be displayed, and in accordance with a memory control signal which is input from the control circuit 105, outputs the video data to the source driver 102. Note that the image memory 104 may be provided internal to the control circuit 105, so that video data is output to the source driver 102 after internal processing by the control circuit 105.

Based on a power control signal which is input from the control circuit 105, the power circuit 103 generates a driving voltage for the gate driver 101, a driving voltage for the source driver 102, and so on, and supplies these to the gate driver 101 and the source driver 102.

Based on a gate driver control signal which is input from the control circuit 105, the gate driver 101 generates a scanning signal for turning ON/OFF the switching element 11 (see FIG. 16) of each of the pixels 10 that are provided in a matrix shape on the liquid crystal display panel 100, and sequentially applies the generated scanning signal to each gate line that is connected to the gate driver.

Based on a source driver control signal which is input from the control circuit 105, the source driver 102 generates a data signal which is in accordance with the video data that is input from the image memory 104, and sequentially applies the generated data signal to a source line that is respectively connected to the source driver 102. The data signal which is supplied from the source driver 102 via the source line is written to the respective pixel 10 when the corresponding switching element 11 is ON.

Although the present embodiment illustrates a construction where the gate driver 101 and the source driver 102 are provided external to the liquid crystal display panel 100, a construction may be adopted such that the gate driver 101 and the source driver 102 are mounted within the periphery of the liquid crystal display panel 100.

Figure 16:
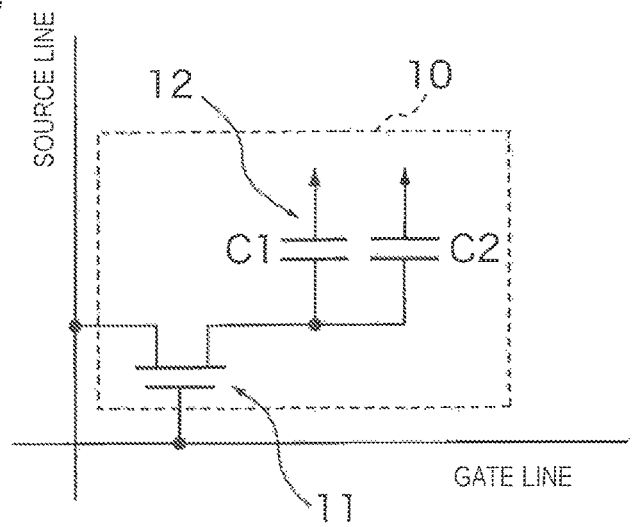
FIG. 16 is a circuit diagram describing an exemplary construction for each pixel.

FIG. 16 is a circuit diagram describing an exemplary construction of a pixel 10. Each pixel 10 includes a switching element 11 and a displaying element 12. The switching element 11 may be a thin film transistor as shown in Embodiment 1, for example, with its source electrode 6A being connected to a source line and its drain electrode GB being connected to a pixel electrode 9. Moreover, the gate electrode 2 of the switching element 11 is connected to a gate line. The switching element 11 changes its ON/OFF states in accordance with the scanning signal being supplied to the gate line, thus being able to electrically isolate the pixel electrode 9 from the source line, or electrically connect the pixel electrode 9 to the source line.

The liquid crystal display panel. 100 includes a counter electrode that is opposed to the pixel electrode 9. A liquid crystal substance is sealed in between the pixel electrode 9 and the counter electrode, whereby a liquid crystal capacitor C1 is created. The counter electrode is connected to a common voltage generation circuit not shown, and as a common voltage Vcom is applied thereto by this common voltage generation circuit, it is maintained at a fixed potential, for example.

Each pixel 10 includes a storage capacitor C2 that is connected in parallel to the liquid crystal capacitor C1, such that, when a voltage is applied to the pixel electrode 9, the charge is also supplied to the storage capacitor C2. Therefore, even during a period when data voltage is not applied via the source line, the pixel 10 is able to retain a voltage value on the basis of the potential that is retained in the storage capacitor C2.

By controlling the magnitude of the voltage that is applied between the pixel electrode 9 and the counter electrode via the gate driver 101, the source driver 102, and the like, and controlling the transmittance of the liquid crystal substance in each pixel 10, the control circuit 105 of the liquid crystal display apparatus adjusts the amount of light transmitted through the liquid crystal substance so as to display an image.

The thin film transistor shown in Embodiment 1 may be adopted as the switching element 11 of each pixel 10, whereby low power consumption can be realized. By adopting the thin film transistor described in Embodiment 1, variation in characteristics between thin film transistors can be suppressed, whereby displaying quality of the liquid crystal display panel 100 can be maintained.

Although Embodiment 2 illustrates a liquid crystal display apparatus as an example display apparatus, the thin film transistor described in Embodiment 1 may be adopted as switching elements for pixel selection, or as switching elements for pixel driving, to be used in an organic EL display apparatus.

The embodiments disclosed herein should be considered in all aspects to be illustrative, rather than restrictive. It is intended that the scope of the present invention is indicated by the claims, rather than bearing the aforementioned meaning, and encompasses any and all possible modifications within the meaning and equivalents of the claims.

Disclosed in addition to the above embodiments are the following notes.

A thin film transistor according to one implementation of the present invention includes: a gate electrode formed on a substrate; a gate insulating layer formed so as to cover the gate electrode; a semiconductor layer formed on the gate insulating layer; and an etch stop film being located above the gate electrode and covering a partial region of the semiconductor layer, wherein the semiconductor layer includes a silicon layer having crystallinity, such that the silicon layer in the partial region covered by the etch stop layer has a higher crystallinity than that of the silicon layer in two regions flanking the partial region so that the partial region is interposed therebetween, the thin film transistor including a source electrode and a drain electrode provided apart from each other on the semiconductor layer, the source electrode being at least partly located above one of the two regions, and the drain electrode being at least partly located above the other one of the two regions.

In a thin film transistor according to one implementation of the present invention, the silicon layer in the partial region is a polycrystalline silicon layer, and the silicon layer in the two regions is a microcrystalline silicon layer.

A thin film transistor according to one implementation of the present invention includes an amorphous silicon layer in the same layer as the polycrystalline silicon layer and the microcrystalline silicon layer.

In a thin film transistor according to one implementation of the present invention, an edge of the etch stop film has an angle of inclination of 45 degrees or less.

A display apparatus according to one implementation of the present invention includes a plurality of displaying elements and the thin film transistor for selecting or driving a displaying element to perform display.

A method of producing a thin film transistor according to one implementation of the present invention involves: forming a gate electrode on a substrate; forming a gate insulating layer so as to cover the gate electrode; forming a semiconductor layer on the gate insulating layer, the semiconductor layer including an amorphous silicon layer; forming an etch stop layer on the semiconductor layer, the etch stop layer having a film thickness predetermined so that an absorptance of the amorphous silicon layer with respect to an energy beam to be radiated has a value within a predetermined range containing a local maximum; removing a portion oft the etch stop film so that the amorphous silicon layer has two regions where the amorphous silicon layer is not covered by the etch stop film; radiating the energy beam from above the etch stop film to alter crystallinity of the amorphous silicon layer of the semiconductor layer so that the crystallinity of the amorphous silicon layer in a region covered by the etch stop film is higher than the crystallinity of the amorphous silicon layer in the two regions not covered by the etch stop film; and forming a source electrode and a drain electrode provided apart from each other on the semiconductor layer, the source electrode being at least partly located above one of the two regions, and the drain electrode being at least partly located above the other one of the two regions.

Figure 17:
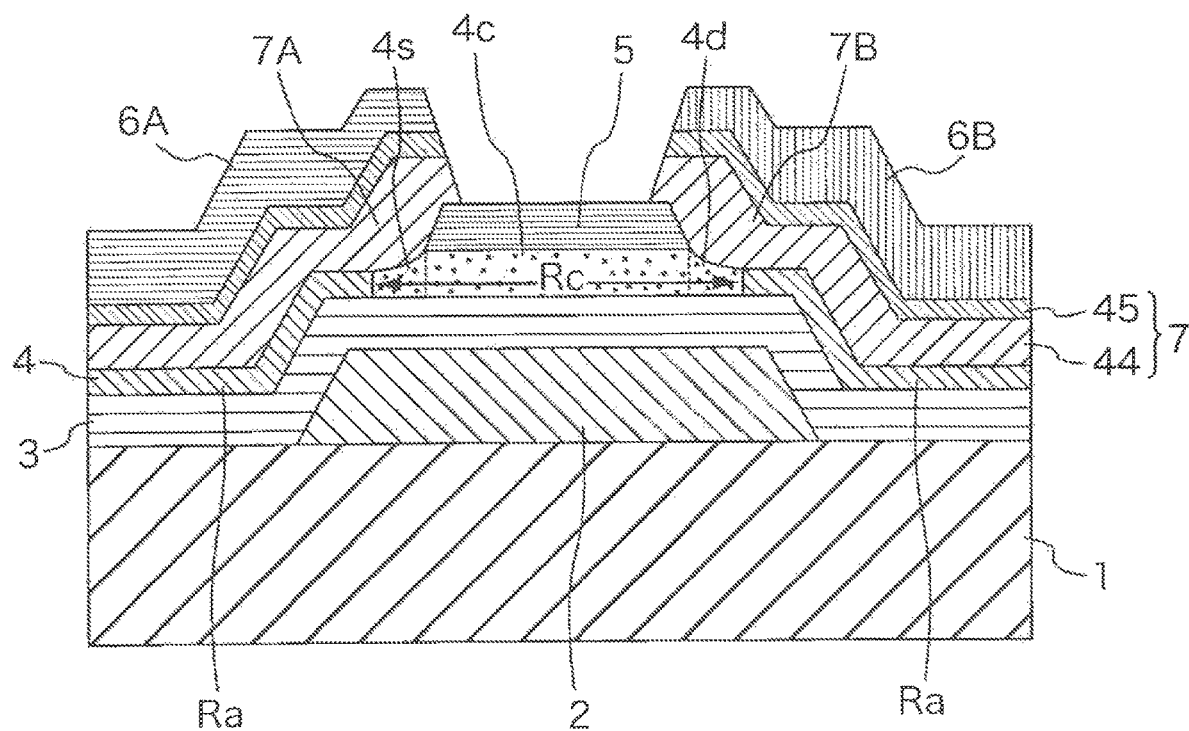
FIG. 17 is a cross-sectional view of a thin film transistor according to an embodiment.
Figure 18A:
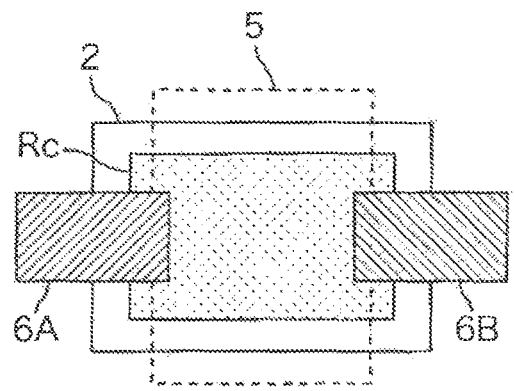
FIG. 18A is a plan view showing still another example of a thin film transistor.
Figure 18B:
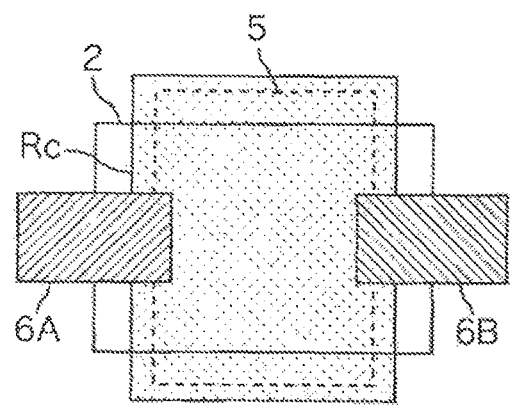
FIG. 18B is a plan view showing still another example of a thin film transistor.
Figure 18C:
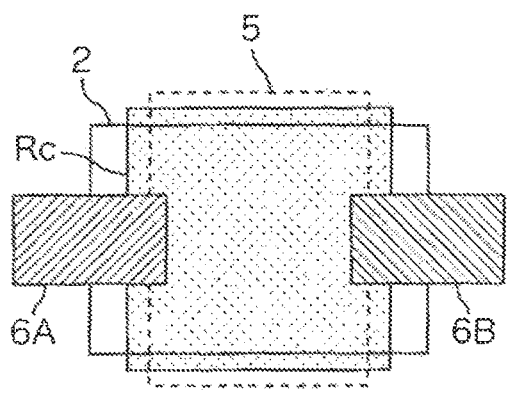
FIG. 18C is a plan view showing still another example of a thin film transistor.
Figure 18D:
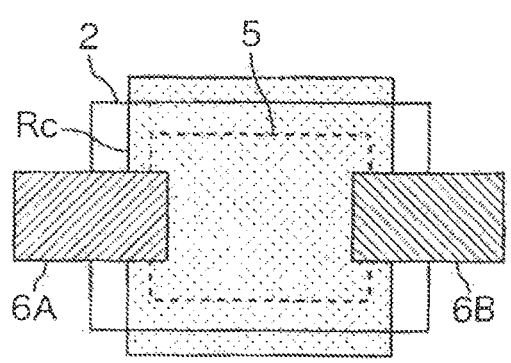
FIG. 18D is a plan view showing still another example of a thin film transistor.
Figure 18E:
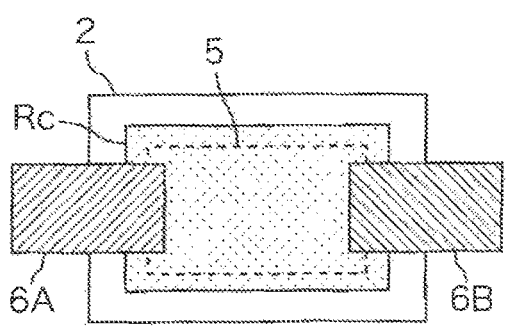
FIG. 18E is a plan view showing still another example of a thin film transistor.
Figure 18F:
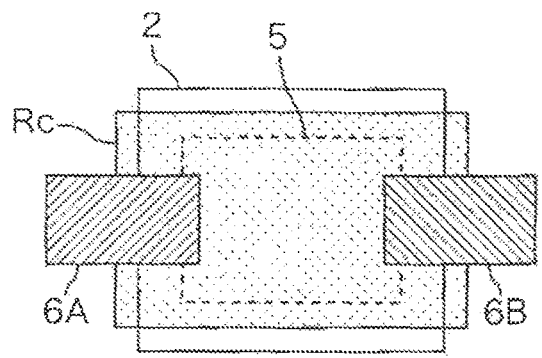
FIG. 18F is a plan view showing still another example of a thin film transistor.

With reference to FIG. 17, the construction of a thin film transistor according to one implementation of the present invention will be further described. The thin film transistor includes: a substrate 1, a gate electrode 2 supported on the substrate 1; a gate insulating layer 3 covering the gate electrode; a semiconductor layer (silicon semiconductor layer) 4 provided on the gate insulating layer 3, the semiconductor layer having a crystalline silicon region Ro; an insulating protection layer (also referred to as an etch stop layer) 5 disposed on a portion of the semiconductor layer 4, and a source electrode 6A and a drain electrode 6B.

In the present specification, the "crystalline silicon region Rc" is a region mainly containing crystalline silicon (including polycrystalline silicon, microcrystalline silicon, and single-crystalline silicon).

The crystalline silicon region Rc includes a first region 4s, a second region 4d, and a channel region 4c located between the first region 4s and the second region 4d. The first region 4s is a region (source contact region) that is electrically connected to the source electrode 6A. The second region 4d is a region (drain contact region) that is electrically connected to the drain electrode 6B. In the present embodiment, the channel region 4c, the first region 4a, and the second region 4d overlap the gate electrode 2 via the gate insulating layer 3.

The insulating protection layer 5 is disposed on the semiconductor layer 4 so as to cover the channel region 4c while exposing the first region 4s and the second region 4d. The insulating protection layer 5 may be in contact with an upper face of the channel region 4c. In the illustrated example, the insulating protection layer 5 has an island shape. The insulating protection layer 5 may have an aperture which is formed so as to cover the entire semiconductor layer 4 and through which the first region 4s of the semiconductor layer 4 is exposed and an aperture through which the second region 4d is exposed.

In a step (source-drain separation step) of patterning the electrically conductive film to form the source electrode 6A and the drain electrode 6B, the insulating protection layer 5 functions as an etch stop layer for protecting the channel region 4c. In other words, the insulating protection layer 5 is formed in a layer below the electrically conductive film (i.e., after the semiconductor layer 4 is formed before the electrically conductive film for the source and drain electrodes is formed). Therefore, a part of the insulating protection layer 5 is located between the semiconductor layer 4 and the source electrode 6A (in this example, between the semiconductor layer 4 and the first contact layer 7A), whereas another part of the insulating protection layer 5 is located between the semiconductor layer 4 and the drain electrode 6B (in this example, between the semiconductor layer 4 and the second contact layer 7B).

In the present embodiment, crystallinity of the channel region 4c of the crystalline silicon region Rc is higher than the crystallinity of the first region 4s and the second region 4d. As described earlier, such a crystal structure may be produced by forming the insulating protection layer 5 on a portion of the amorphous silicon film and thereafter performing a crystallization step of radiating laser light from above the insulating protection layer 5, thereby controlling the laser light absorptance associated with the portion of the semiconductor film that is covered by the insulating protection layer 5 (i.e., reflectance of laser light by the multilayer structure including the insulating protection layer 5).

In one example, an average crystal grain size in the channel region 4c may be larger than an average crystal grain size in the first region 4s and the second region 4d. Alternatively, a crystallization rate in the channel region 4c as measured by using Raman spectroscopy may be greater than a crystallization rate in the first region 4s and the second region 4d. In other words, the volumetric ratio of the amorphous phase contained in the channel region 4c may be smaller than the volumetric ratio of the amorphous phase contained in the first region 4s and the second region 4d.

The channel region 4c, the first region 4s, and the second region 44d may each contain polycrystalline silicon. Alternatively, these regions may each contain microcrystalline silicon. Alternatively, the channel region 4c may contain polycrystalline silicon, while the first region 4s and the second region 44d may contain microcrystalline silicon.

In addition to the crystalline silicon region Rc, the semiconductor layer 4 may further have an amorphous silicon region Ra. For example, when only a portion of the amorphous silicon film is irradiated with laser light to be crystallized, the region irradiated with the laser light becomes the crystalline silicon region Rc, while the region not irradiated with the laser light remains as the amorphous silicon region Ra. For such a crystallization method, the entire disclosure of International Publication No. 2011/055618, International Publication No. 2011/132559, International Publication No. 2016/157351, and International Publication No. 2016/170571, for example, is incorporated herein by reference.

The thin film transistor may further include a first contact layer 7A which is disposed between the first region 4s and the source electrode 6A to connect the source electrode 6A and the first region 4s, and a second contact layer 7B which is disposed between the second region 4d and the drain electrode 6B to connect the drain electrode 6B and the second region 4d. The first contact layer 7A and the second contact layer 7B (hereinafter collectively referred to as the "contact layer 7") each contain an n type impurity. An n$^+$ silicon layer 45 containing the n type impurity may be an amorphous silicon layer, or a crystalline silicon layer. An upper face of the n$^+$ silicon layer 45 may be directly in contact with the source electrode 6A or the drain electrode 6B. The respective n$^+$ silicon layers 45 in the first contact layer 7A and the second contact layer 78 are disposed apart from each other.

The contact layer 7 may have a multilayer structure including the n$^+$ silicon layer 45 and a second amorphous silicon layer 44 disposed on the substrate 1 side of the n$^+$ silicon layer 45. The second amorphous silicon layer 44 may be intrinsic (i.e., containing substantially no impurities), or contain an impurity at a concentration lower than that in the n$^+$ silicon layer 45. A lower face of the second amorphous silicon layer 44 may be directly in contact with the first region 4s or the second region 4d. Although the respective n$^+$ silicon layers 45 in the first contact layer 7A and the second contact layer 7B are disposed separate from each other, the respective second amorphous silicon layers 44 in the first contact layer 7A and the second contact layer 78 may not be separate (i.e., may be connected above the insulating protection layer 5).

The contact layer 7 may be a single n$^+$ silicon layer 45. In this case, a lower face of the n silicon layer 45 may be directly in contact with the first region 4s or the second region 4d.

As described above, the angle of inclination of a side face of the insulating protection layer 5 (i.e., the angle between the lower face and the side face of the insulating protection layer 5) may be e.g. 45° or less. Moreover, the angle of inclination may be 20° or more. In the case where the insulating protection layer 5 does not have an island shape, but is formed so as to cover the entire semiconductor layer 4 and has apertures each exposing the first region 4a and the second region 4d of the semiconductor layer 4, the angle of inclination of the side face of the insulating protection layer 5 refers to an angle between the lower face of the insulating protection layer 5 and the inner wall surface of each aperture.

Moreover, a thin film transistor according to the present embodiment may be produced as follows, for example. First, on the substrate 1, the gate electrode 2 and the gate insulating layer 3 covering the gate electrode 2 are formed. Next, on the gate insulating layer 3, a semiconductor film 40 composed of amorphous silicon is formed. Then, on the semiconductor film 40, an insulating film to become the insulating protection film is formed, and the insulating film is patterned to give the insulating protection layer 5 covering a portion of the semiconductor film 40 to become the channel region (see FIG. 3B).

Thereafter, the semiconductor film 40 is irradiated with laser light from above the insulating protection layer 5, thereby being crystallized in such a manner that, in a region that overlaps the gate electrode 2 as viewed from the normal direction of the substrate 1, a portion of the semiconductor film 40 that is covered by the insulating protection layer 5 has a crystallinity which is higher than the crystallinity of the portion that is not covered by the insulating protection layer 5. As a result of this, the region which was laser-irradiated becomes crystallized, whereby the semiconductor layer 4 having the crystalline silicon region Rc is obtained.

Next, the source electrode 6A, which is electrically connected with a part (which herein is the first region 4s) of the portion of the crystalline silicon region Rc that is not covered by the insulating protection layer 5, and the drain electrode 6B, which is electrically connected with another part (which herein is the second region 44) of the portion of the crystalline silicon region Rc that is not covered by the insulating protection layer 5, are formed. In this manner, the thin film transistor is produced.

According to the present embodiment, the crystallinity of portions of the semiconductor layer (active layer) 4 of the thin film transistor to serve as a path for a current flowing between the source electrode 6A and the drain electrode 6B (i.e., the first region 4s, the second region 4d, and the channel region 4c) is lowered locally (e.g., herein, the crystallinity of the first region 4s and the second region 4d is made lower than that of the channel region 4c), whereby the OFF current can be reduced while suppressing a decrease in mobility of the thin film transistor. As a result, the OFF characteristics can be enhanced while ensuring desired ON characteristics.

Moreover, when a thin film transistor is produced by the above-described method, after patterning the insulating protection film to form the insulating protection layer 5, the semiconductor film 40 is irradiated with laser light from above the patterned insulating protection layer 5 in order to effect laser annealing. Thus, crystallinity can be differentiated between the portion that is covered by the insulating protection layer 5 and the portion(s) not covered by the insulating protection layer 5, within the semiconductor film 40. That is, by using the insulating protection layer 5, it is possible to selectively form regions with different levels of crystallinity, without having to perform laser annealing a plurality of times under different irradiation conditions.

The relative positioning between the gate electrode 2, the insulating protection layer 5, and the crystalline silicon region Rc (i.e., the region irradiated with laser light), as viewed from the normal direction of the substrate 1, is not limited to the examples illustrated in FIG. 1 and FIG. 9 through FIG. 13. FIG. 18A through FIG. 18F are plan views showing still other examples of the thin film transistor. For example, exemplary arrangements illustrated in FIG. 18A through FIG. 18F are possible. In all these exemplary arrangements, the insulating protection layer 5 is disposed so as to overlap only a portion of the gate electrode 2. Moreover, the crystalline silicon region Rc is disposed so as to at least partly overlap the gate electrode 2. The crystalline silicon region Rc includes a portion overlapping both of the gate electrode 2 and the insulating protection layer 5 and a portion that overlaps the gate electrode 2 but does not overlap the insulating protection layer 5.

For example, as viewed from the normal direction of the substrate 1, the insulating protection layer 5 may extend so as to traverse the crystalline silicon region Rc along the channel width direction of the thin film transistor. Alternatively, the insulating protection layer 5 may have an island shape, and be located inside the crystalline silicon region Rc as viewed from the normal direction of the substrate 1. The crystalline silicon region Rc may be located inside the gate electrode 2 as viewed from the normal direction of the substrate 1. Alternatively, a portion of the crystalline silicon region Rc may not overlap the gate electrode 2. For example, the entire semiconductor film may be crystallized by a laser annealing method which involves scanning the entire surface of a semiconductor film that is composed of amorphous silicon.

The present application is based on Japanese Patent Application No. 2018-123445, filed on Jun. 28, 2018, the entire disclosure of which is incorporated herein by reference.

What is claimed is:

1. A thin film transistor comprising:
    a substrate;
    a gate electrode supported by the substrate;
    a gate insulating layer covering the gate electrode;
    a silicon semiconductor layer being provided on the gate insulating layer and having a crystalline silicon region, the crystalline silicon region including a first region, a second region, and a channel region located between the first region and the second region, such that the channel region, the first region, and the second region overlap the gate electrode via the gate insulating layer;
    an insulating protection layer disposed on the silicon semiconductor layer so as to cover the channel region and allow the first region and the second region to be exposed;
    a source electrode electrically connected to the first region; and
    a drain electrode electrically connected to the second region,
    wherein, when viewed from a normal direction of the substrate, the crystalline silicon region of the silicon semiconductor layer has a first crystalline portion that overlaps the insulating protection layer and an upper surface of the gate electrode, and a second crystalline portion that overlaps the upper surface of the gate electrode but does not overlap the insulating protection layer, the first crystalline portion including the channel region, the second crystalline portion including the first region and the second region, and
    the first crystalline portion is higher in crystallinity than the second crystalline portion.

2. The thin film transistor of claim 1, wherein an average crystal grain size in the first crystalline portion is larger than an average crystal grain size in the second crystalline portion.

3. The thin film transistor of claim 1, wherein,
    the channel region includes polycrystalline silicon; and
    the first region and the second region include microcrystalline silicon.

4. The thin film transistor of claim 1, wherein the silicon semiconductor layer further comprises an amorphous silicon region.

5. The thin film transistor of claim 1, wherein a part of the insulating protection layer is located between the silicon semiconductor layer and the source electrode, and another part of the insulating protection layer is located between the silicon semiconductor layer and the drain electrode.

6. The thin film transistor of claim 1, wherein an angle of inclination of a side face of the insulating protection layer is 45° or less.

7. The thin film transistor of claim 1, further comprising:
    a first contact layer being disposed between the first region and the source electrode and connecting the source electrode and the first region; and
    a second contact layer being disposed between the second region and the drain electrode and connecting the drain electrode and the second region, wherein
    the first contact layer and the second contact layer each include an $n^+$ silicon layer containing an n type impurity.

8. A display apparatus comprising:
    the thin film transistors of claim 1; and
    a displaying region having a plurality of pixels, wherein
    the thin film transistors are respectively disposed in the plurality of pixels.

9. A method of producing a thin film transistor, comprising:
    step (A) of providing a substrate, the substrate having formed on a surface thereof a gate electrode and a gate insulating layer covering the gate electrode;
    step (B) of forming a semiconductor film of amorphous silicon on the gate insulating layer;
    step (C) of forming an insulating film on the semiconductor film, and patterning the insulating film so as to form an insulating protection layer covering a portion of the semiconductor film to become a channel region;
    step (D) of irradiating the semiconductor film with laser light from above the insulating protection layer to crystallize the semiconductor film so that, in a region overlapping the gate electrode as viewed from a normal direction of the substrate, a portion of the semiconductor film that is covered by the insulating protection layer has a crystallinity which is higher than a crystallinity of a portion of the semiconductor film that is not covered by the insulating protection layer; and
    step (E) of forming a source electrode which is electrically connected to a part of the portion of the semiconductor film that is not covered by the insulating protection layer and a drain electrode which is electrically connected to another part of the portion of the semiconductor film that is not covered by the insulating protection layer.

10. The method of producing of claim 9, wherein the laser light has a wavelength of about 351 nm, and the insulating protection layer is a silicon oxide layer.

11. The method of producing of claim 9, wherein, in step (D), only a portion of the semiconductor film is irradiated with the laser light to be crystallized, while a portion of the semiconductor film that was not irradiated with the laser light is left amorphous.

12. A thin film transistor comprising:
    a substrate;
    a gate electrode supported by the substrate;
    a gate insulating layer covering the gate electrode;
    a silicon semiconductor layer being provided on the gate insulating layer and having a crystalline silicon region, the crystalline silicon region including a first region, a second region, and a channel region located between the first region and the second region, such that the channel region, the first region, and the second region overlap the gate electrode via the gate insulating layer;

an insulating protection layer disposed on the silicon semiconductor layer so as to cover the channel region and allow the first region and the second region to be exposed;

a source electrode electrically connected to the first region; and a drain electrode electrically connected to the second region, wherein the channel region is higher in crystallinity than the first region and the second region, and the insulating protection layer has a forward tapered side face, an angle of inclination of the side face of the insulating protection layer being 45° or less.

13. The thin film transistor of claim 1, wherein the insulating protection layer has an upper surface and a forward tapered side face, when viewed from the normal direction of the substrate, the first crystalline portion includes a center portion that overlaps the upper surface of the insulating protection layer, and a side portion that overlaps the side face of the insulating protection layer, and the center portion of the first crystalline portion is higher in crystallinity than the second crystalline portion, and the side portion of the first crystalline portion is higher in crystallinity than the second crystalline portion.

14. The thin film transistor of claim 13, wherein the center portion is higher in crystallinity than the side portion.

* * * * *